United States Patent [19]

Kobayashi et al.

[11] Patent Number: 5,240,422
[45] Date of Patent: Aug. 31, 1993

[54] CONNECTOR

[75] Inventors: Tetsuya Kobayashi; Kenjirou Katabuchi; Toshinori Yoshino, all of Tokyo, Japan

[73] Assignee: NEC Corporation, Japan

[21] Appl. No.: 904,977

[22] Filed: Jun. 26, 1992

[30] Foreign Application Priority Data

Jun. 28, 1991 [JP] Japan .................................. 3-158865

[51] Int. Cl.$^5$ .............................................. H01R 9/09
[52] U.S. Cl. ........................................ 439/78; 439/79; 439/82
[58] Field of Search ................................ 439/78-82

[56] References Cited

U.S. PATENT DOCUMENTS

| 4,674,812 | 6/1987 | Thom et al. | 439/78 |
| 4,859,190 | 8/1989 | Anderson | 439/78 |
| 4,950,170 | 8/1990 | Miller, Jr. | 439/82 |
| 4,995,819 | 2/1991 | Ohl | 439/79 |
| 5,145,383 | 9/1992 | Bowen et al. | 439/78 |

OTHER PUBLICATIONS

DuPont HPC Connector System, 712 Bulletin Jan. 1987.

Primary Examiner—Paula A. Bradley
Attorney, Agent, or Firm—Ostrolenk, Faber, Gerb & Soffen

[57] ABSTRACT

A connector including an insulating main body through which numerous holes are formed in three arrays, the main body having numerous contactor pins inserted through the holes. The contactor pins are either first cranked pins whose folded portions are relatively long or second cranked pins whose folded portions are relatively short. In the first and third arrays, the first and second pins are alternately arranged, and all the pins in each of these arrays lie on the side of each array opposite the second array. The second array includes only the second pins and they are located in the second array arranged so that the folded portions of the pins alternately lie at the side of the first and third arrays. Even if the pitch of the holes of each array is reduced, an array of rectilinear portions of the second pins of increased pitch can be formed on both sides of the second array. The connector can be used with a socket having a standard contactor member when it is used in a back harness arrangement.

8 Claims, 4 Drawing Sheets

FIG.1
(PRIOR ART)
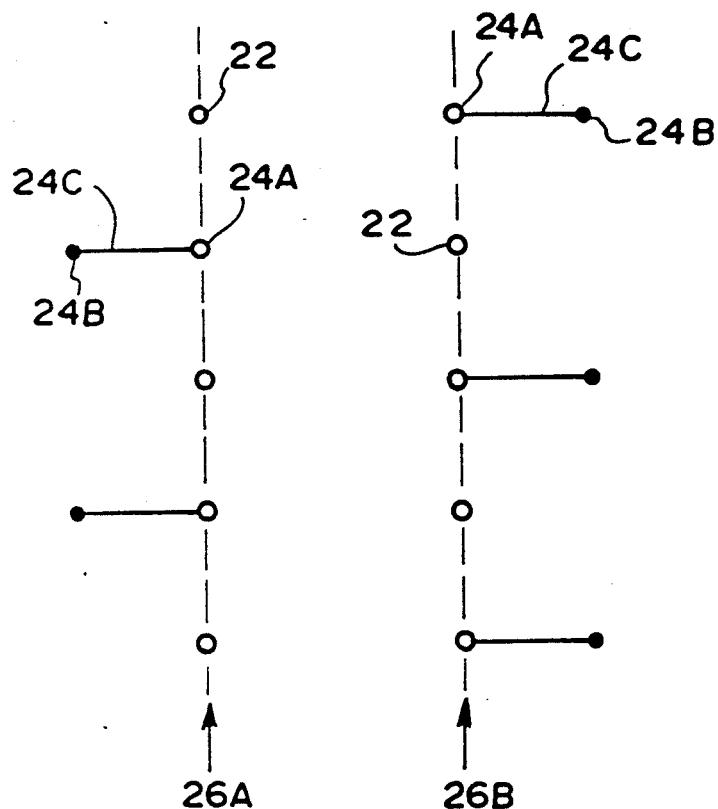
FIG.2A
(PRIOR ART)
FIG.2B
(PRIOR ART)
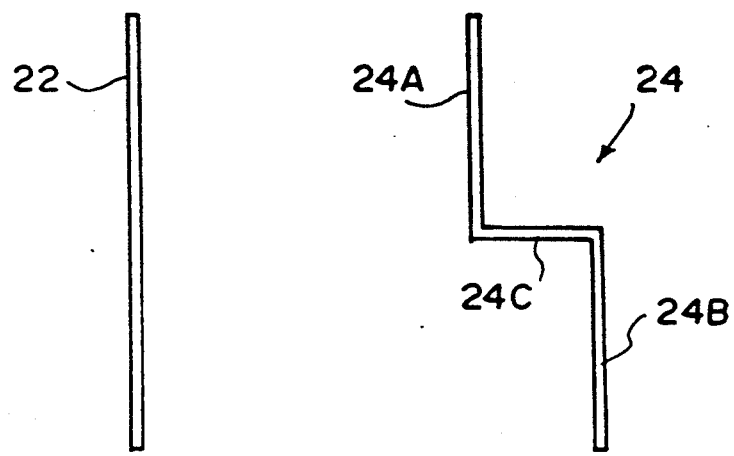

CONNECTOR

FIELD OF THE INVENTION

The present invention relates to a connector comprising an insulating main body and electrically conductive contactor pins, the connector being used in an electronic apparatus and, in particular, to a connector having an arrangement applicable to a hypermultiple-contact, half-pitch connector.

BACKGROUND OF THE INVENTION

In a conventional multiple-contact connector, two arrays of holes each passing through from one surface side to the other surface side are formed through an insulating main body to insert electrically conductive contactor pins therein by, for example, press fitting. At one surface side of the main body, the connector is fixed to a printed wiring board while each contactor pin is electrically connected to the printed wiring formed on the wiring board, or the tip end portion of each contactor pin is protruded up to the rear surface side of the print wiring board to fit a socket with the tip end portion. Further, the connector is fitted with the socket on the other surface side of the main body, where each contactor pin of the connector comes in contact with a corresponding contactor member of the socket.

FIG. 1 illustrates a schematic view of such an array of the contactor pin, as viewed from one surface side, when the pin is fitted within the hole of the main body. FIGS. 2A and 2B are respectively a lateral view illustrating the shape of the contactor pin used herein. A first contactor pin 22 illustrated in FIG. 2A is of rectilinear form. A second contactor pin 24 illustrated in FIG. 2B is of cranked form with a first rectilinear portion 24A and a second rectilinear portion 24B connected with a folded portion 24C. For the second pin 24, the first rectilinear portion 24A is inserted into the main body. Referring to FIG. 1A, white dot indicates the position of a hole of the main body and the position of the first pin or the first rectilinear portion of the second pin, which are inserted into the main body at the same position, and a black dot indicates a second rectilinear portion of the second pin. A line connecting the white and black dots indicates the folded portion 24C of the second pin. As seen from FIG. 1, the holes of the main body are arranged in two arrays 26A and 26B which are parallel and, for each array of 26A and 26B, the first pin 22 and the second pin 24 are alternately disposed while the first pin 22 for one array and the second pin 24 for the other array are disposed at a corresponding position. In addition, the second rectilinear portion 24B of the second pin 24 for each array is positioned at the opposite position of the other array.

According to this arrangement, even if the interval between the holes for each array is made smaller with a half pitch (that is, a half of a normal pitch, which is 1/10 inch in interval), the interval between the pins at the side where they are connected to the printed wiring board can be made larger to thereby widen the interval between the holes formed on the printed wiring board.

However, in the foregoing conventional half-pitch connector, if there are three arrays of holes in the main body having three arrays pins inserted therein, and the tip end of the pins protrude up to the rear surface of the printed wiring board so that the protruding end portions are used to fit a socket therewith to form a so-called back harness arrangement, then a non-standard socket must be used, the contactor member being arranged in the form of a staggered lattice.

SUMMARY OF THE INVENTION

Accordingly, an object of the present invention is to provide a connector having three or more arrays of contactor pins the interval between the contactor pin portions fitting with a printed wiring board, while at the same time, when it is applied to a back harness arrangement, the connector being capable of use with a socket having a standardly disposed contactor member of constant pitch.

According to the present invention, there is provided a connector comprising an insulating main body in which a plurality of holes each pass through from a first surface to a second surface. The holes are formed in three arrays and a plurality of contactor pins are inserted through the holes of the main body and are disposed in parallel to the three arrays.

The contactor pins include, a first cranked contactor pin having a relatively long folded portion, and a second cranked contactor pin having a relatively short folded portion.

In the first array, the first contactor pin and the second contactor pin are alternately arranged. The folded portions of these contactor pins are arranged at the side opposite to the second array side relative to the position of the hole of the main body, within which the contactor pin is inserted.

In the second array, the second contactor pins are arranged in an alternating manner with the folded portion of one pin facing the first array and the folded portion of an adjacent pin facing the third array, the pins in the second array facing the first array being positioned at a position corresponding to the positions of the second contactor pins in the first array.

In the third array, the first contactor pin and the second contactor pin are alternately disposed, and the folded portion of these contactor pins lies at the side opposite to the second array side relative to the position of the holes of the main body within which the contactor pin is inserted. The first and second contactor pins being arranged in the third array at positions corresponding to the positions of the second and first contactor pins of the first array, respectively.

The pitch with which the arrays are arranged can be, for example, 1.5 to 3 times and, preferably, twice, the pitch with which the holes for each array are arranged. The length of the folded portion of the first contactor pin can be twice to four times and, preferably, three times that of the folded portion of the second contactor pin. Further, the length of the folded portion of the first contactor pin can be once to twice and, preferably, 1.5 times of the pitch with which the arrays are arranged.

In addition, according to the present invention, even if the holes of the main body are arranged in a number of arrays of a multiple of 3, the number of arrays being greater than 6 or more, each three arrays can be chosen as a unit so that the foregoing connector arrangement may be applied to each unit. In this case, the first contactor pin for the third array for either one of adjacent two units is preferably disposed at a position corresponding to the first contactor pin for the first array for the other unit adjacent to the third array.

In the second array, the second rectilinear portion of the second contactor pin is alternately distributed to the first and third array sides so as to correspond to the second rectilinear portion of the second contactor pin for the first and third arrays, as discussed above accordingly, even if the pitch of the first rectilinear portion of the contactor pins for each array is reduced, an array of the second rectilinear portion of the second pins of greater pitch can be formed on both sides of the second array.

BRIEF DESCRIPTION OF THE DRAWINGS

FIG. 1 is a schematic view of the contactor pin array fitted within the hole of the main body for a conventional connector when it is viewed from one surface side of the main body;

FIGS. 2A and 2B are respectively a lateral view illustrating the shape of the contactor pin used herein;

DETAILED DESCRIPTION OF THE PREFERRED EMBODIMENTS

Figure 3:
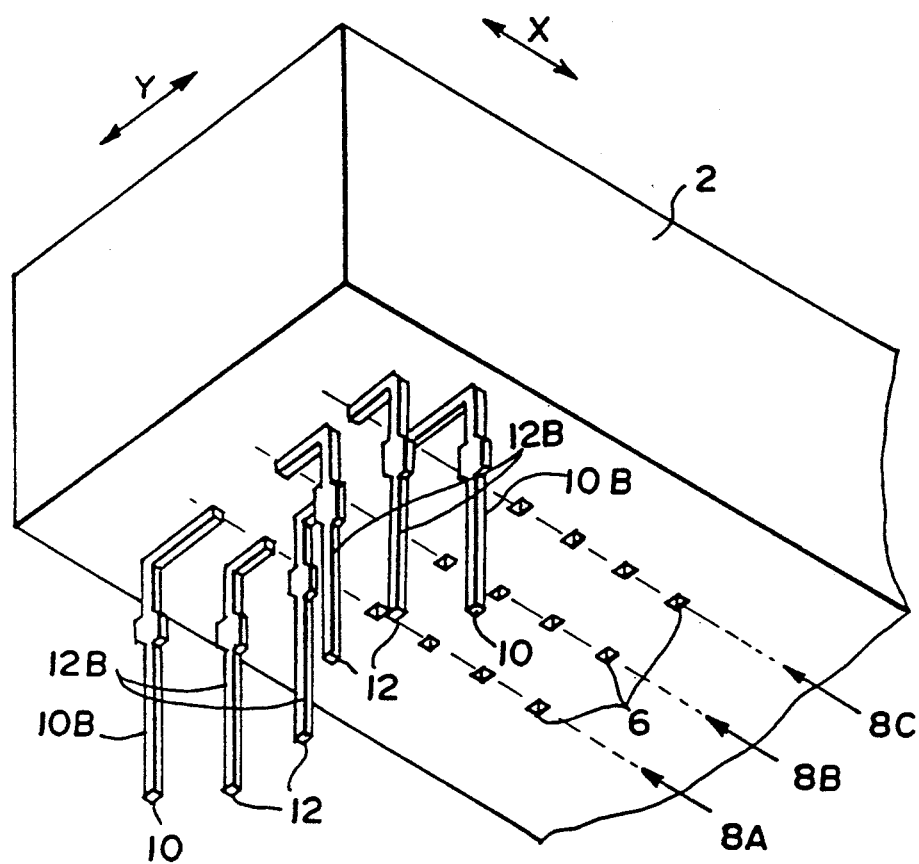
FIG. 3 is a partially omitted perspective view illustrating a specific embodiment of a connector according to the present invention.
Figure 4:
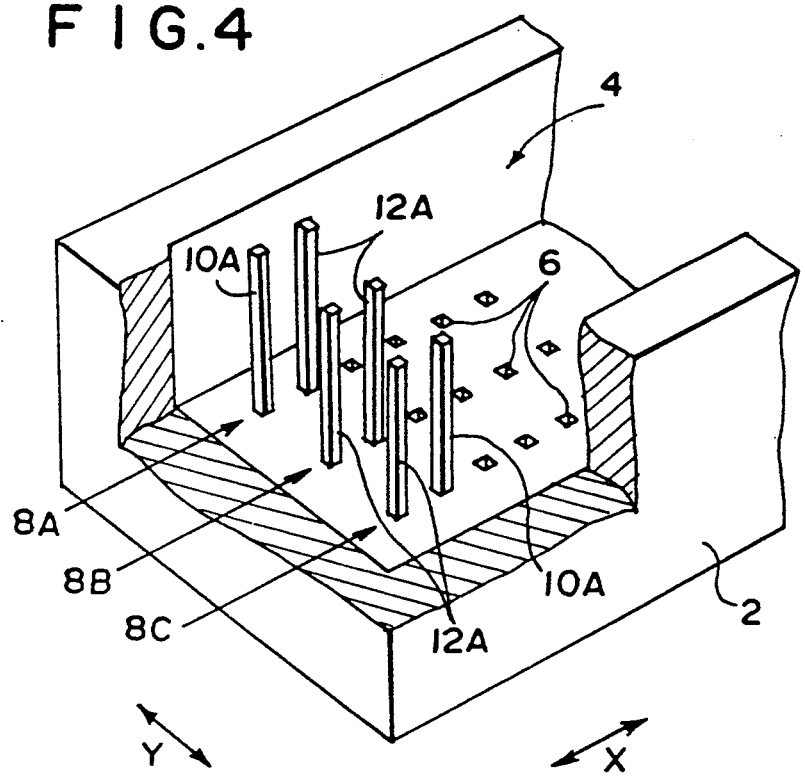
FIG. 4 is a partially cutaway and partially omitted perspective view of the same.

FIG. 3 is a partially omitted perspective view illustrating a specific embodiment of a connector according to the present invention, and FIG. 4 is a partially cutaway and partially omitted perspective view of the same.

In these figures, reference numeral 2 denotes a main body made of an insulating material, for example, an insulating plastic. The main body is generally of rectangular form, at the upper surface of which a recessed portion 4 is formed. On the main body 2, holes 6 are formed passing from the lower surface to the bottom surface of the recessed portion 4, and the holes are formed in three arrays in the longitudinal direction X of the main body 2. Reference numerals 8A, 8B and 8C denote these arrays. For each of the three arrays, the holes are disposed with the same pitch, and the corresponding holes of the three arrays are lined up in the direction of Y which intersects at a right angle with the foregoing direction of X. Through each hole 6, the first contactor pin 10 or the second contactor pin 12 are inserted by, for example, press fitting. In FIGS. 3 and 4, some of the contactor pins are shown, however others not shown.

Figure 5A:
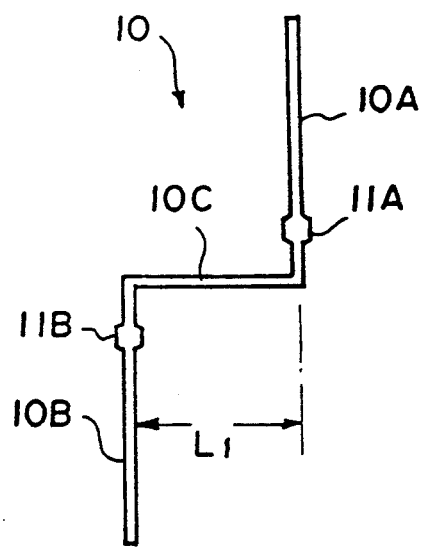
FIGS. 5A and 5B are respectively a lateral view illustrating the shape of the contactor pin used in the embodiment of the present invention.
Figure 5B:
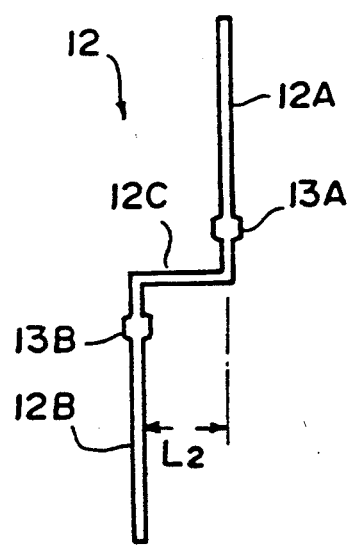

Pin 10 is cranked, as shown in FIG. 5A, the first rectilinear portion 10A and the second rectilinear portion 10B running parallel thereto are connected by a folded portion 10C intersecting at a right angle therewith. At the first and second rectilinear portions 10A and 10B, wide portions 11A, 11B are each formed. Likewise, pin 12 is cranked, as shown in FIG. 5B, the first rectilinear portion 12A and the second rectilinear portion 12B running parallel thereto are connected by a folded portion 12C intersecting at a right angle therewith. Wide portions 13A, 13B are formed at the first rectilinear portion 12A and the second rectilinear portion 12B. The length of the folded portion is different between the pins 10 and 12. That is, the length of the folded portion 10C of the pin 10 is $L_1$, and the length of the folded portion 12C of the pin 12 is $L_2 (<L_1)$. As can be seen from FIGS. 3 and 4, the cross section of the contactor pins 10, 12 is of substantially square form except for the wide portions 11A, 11B or 13A, 13B. These contactor pins can be made by press work.

Figure 6:
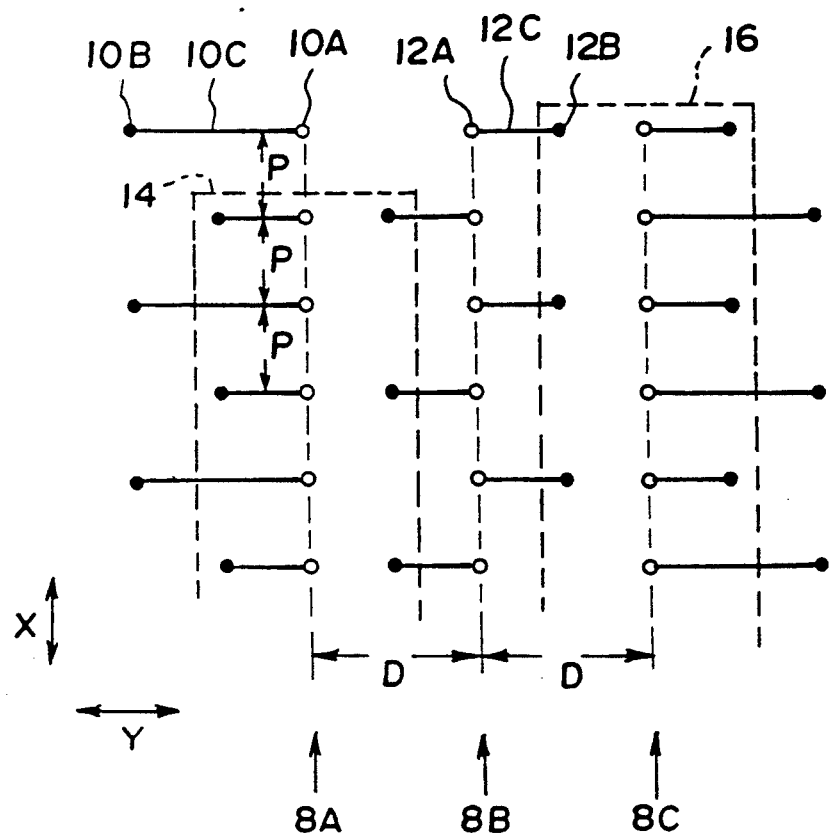
FIG. 6 is a view taken from the lower surface side of the main body which illustrates how the contactor pin is fitted within each hole of the main body in the embodiment of the present invention.

FIG. 6 is a view from the lower surface side of the main body illustrating how these two kinds of contactor pins are fitted into each hole of the three arrays. In this figure, a white dot denotes the position of the first rectilinear portion 10A or 12A of the contactor pin which is fitted within the hole of the main body, and a black dot denotes the position of the second rectilinear portion 10B or 12B which is erected on the lower surface of the main body. The line connecting these white and black dots denotes a folded portion 10C or 12C. The folded portions 10C, 12C of each pin 10, 12 each run in the direction of Y.

The interval between the first and second arrays, i.e. the distance between the centers of the corresponding holes, and the interval between the second and third arrays are each D, and the interval between the centers of the adjacent holes for each array is P. For the first array 8A, the first and second pins 10 and 12 are alternately disposed, and the second rectilinear portion of each pin lies at the side opposite to the second array side relative to the first rectilinear portion. For the second array 8B, only the second pin 12 is inserted therein and the pins whose second rectilinear portion lies at the side of the first array relative to the first rectilinear portion alternate with pins whose second rectilinear portion lies at the side of the third array. For the third array 8C, the first and second pins 10 and 12 are alternately disposed, and the second rectilinear portion of each pin lies at the side opposite to the second array side relative to the first rectilinear portion. The first pin of the first array and the second pin of the third array are disposed at a corresponding position, the second pin of the second array whose second rectilinear portion is disposed at the side of the first array relative to the first rectilinear portion is disposed corresponding to the second pin of the first array, and the second pin of the second array whose second rectilinear portion is disposed at the side of the third array relative to the first rectilinear portion is disposed corresponding to the second pin of the third array.

In this embodiment, the foregoing interval D may be set to 1/10 inch, the foregoing interval P to 1/20 inch (half pitch), the length $L_1$ of the folded portion 10C of the pin 10 to 3/20 inch and the length $L_2$ of the folded portion 12C of the pin 12 1/20 inch. But those are not restricted to the foregoing values.

The first rectilinear portion of the pin for each array passes through the main body 2 upwardly to protrude into the recessed portion 4. In consequence, the arrays of the contactor pin which each correspond to the foregoing first through third arrays are formed within the recessed portion 4. These are engaged with the corresponding socket (not shown). On the other hand, the array of the second rectilinear portion of each contactor pin results as shown by a black dot in FIG. 6. The interval between the adjacent second rectilinear portions becomes greater than the interval P between the adjacent holes for each array, and the array of the second rectilinear portion 12B of the second contactor pin 12 results in two sets of square lattice arrays 14, 16. Therefore, when the connector is applied to the back harness arrangement, two sockets of square lattice array having a predetermined pitch (normal pitch) corresponding to the foregoing two sets of arrays, 14, 16 can be used.

Figure 7:
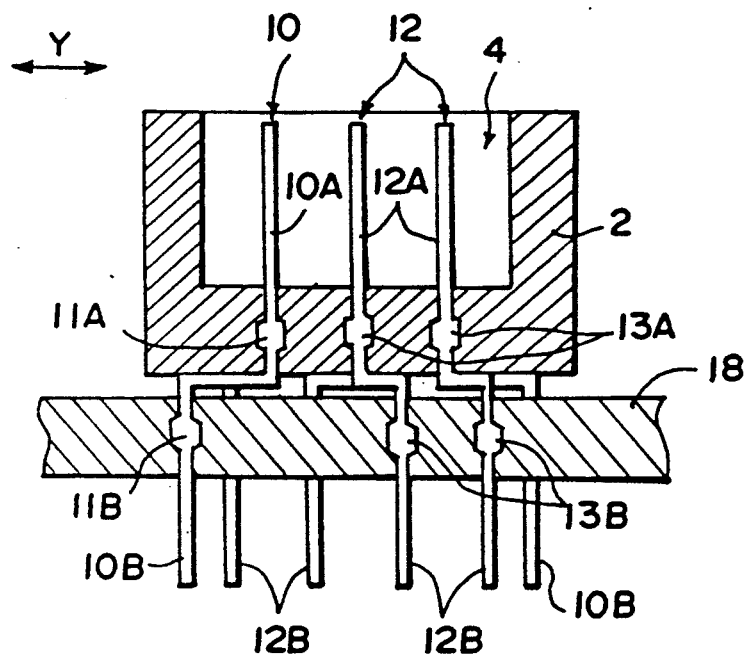
FIG. 7 is a schematic cross-sectional view in which the connector of the embodiment of the present invention is applied to the back harness arrangement.

FIG. 7 illustrates a schematic cross-sectional view when the foregoing connector is applied to the back harness arrangement. In the same figure, reference numeral 18 denotes a printed wiring board. The second rectilinear portions 10B, 12B of the connector pin can be fitted into the printed wiring board by press fitting, in which case the engagement can be fully maintained by the wide portions 11B, 13B. In place of the press fitting, connection by soldering can be used. A socket (not shown) is fitted into the second rectilinear portions, which pass through the printed wiring board to protrude downwardly.

Figure 8:
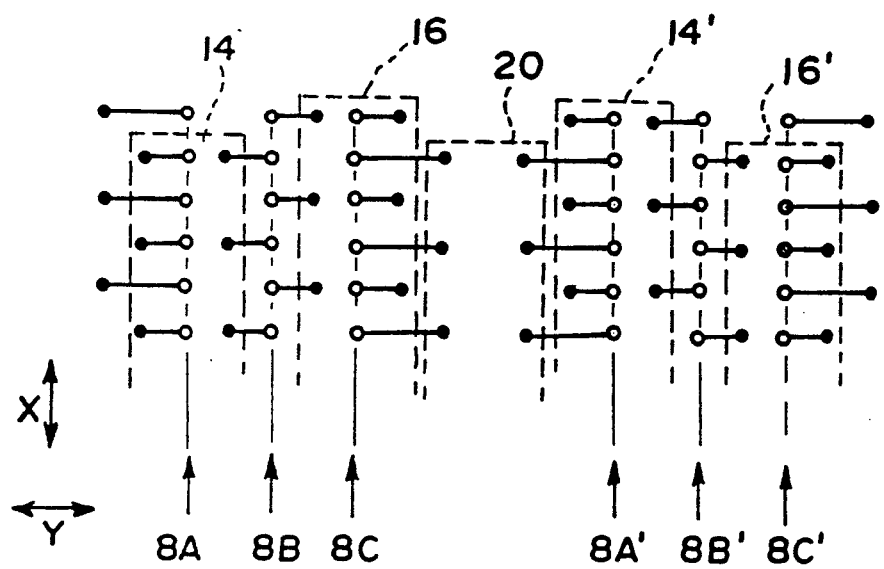
FIG. 8 is a view similar to FIG. 6 taken from the lower surface side of the main body which illustrates how the contactor pins are fitted within each hole of the main body according to another embodiment of the connector of the present invention.

The foregoing set of three arrays of holes, that is, of the contactor pin arrays, can be used in plural numbers as one unit. FIG. 8 is a view as seen from the lower side of the main body, which is similar to the foregoing FIG. 6. FIG. 8, two kinds of contactor pins are each fitted within the hole. The first set is indicated by a sign similar to that of FIG. 6, and the second set is indicated by a sign attached with ' to those signs. In this case, by properly setting the positional relationship between the third array 8C of the first set and the first array 8A' of the adjacent second set, the array of the second rectilinear portion of the first pin of these two arrays can be set to a square lattice array 20. Therefore, when this connector is applied to the back harness arrangement, it becomes possible to use a socket having a square lattice contactor array of a predetermined pitch striding over the first and second sets.

The present invention is not restricted to the foregoing embodiments, but various changes and modifications are possible within the scope and spirit of the appended claims.

What is claimed is:

1. A connector, comprising:
   a) an insulating main body having first and second opposed surfaces and a plurality of apertures extending therebetween, each of said apertures extending along an axis generally parallel to a first axis, said apertures being arranged in three arrays, each array extending along a respective line generally parallel to a second axis extending perpendicular to said first axis, said arrays being spaced apart from one another as measured along a third imaginary axis extending perpendicular to said first and second imaginary axes; and
   b) a plurality of first contactor pins and a plurality of second contactor pins, each said pin extending through a respective said aperture, each contactor pin having first and second offset sections extending generally parallel to said first axis and a third section connecting said first and second sections and extending generally perpendicular to said first axis, said third section of each of said first contactor pins being longer than said third section of each of said second contactor pins, wherein:
      1) said first and third arrays respectively contain both first and second contactor pins at alternating positions, said third portions of both of said first and second contactor pins located in said first and third arrays extend along said third imaginary axis away from said second array; and
      2) said second array contains said second contactor pins, said third portions of said second contactor pins located in said second array extend along said third imaginary axis and alternate between extending toward said first array and extending toward said third array, said second contactor pins located in said second array having third portions extending towards said first array are positioned in said second array at positions corresponding to positions of said second contactor pins in said first array, said second contactor pins located in said second array having third portions extending towards said third array are positioned in said second array at positions corresponding to positions of said second contactor pins in said third array.

2. The connector of claim 1, wherein said arrays are spaced at a distance which is 1.5 to 3 times the distance between said apertures of each array.

3. The connector of claim 1, wherein said third portion of each of said first contactor pins is 2 to 4 times longer than said third portion of each of said second contactor pins.

4. The connector of claim 1, wherein said third portion of each of said first contactor pins is 1 to 2 times longer than the distance between said arrays.

5. A connector, comprising:
   a) an insulating main body having first and second opposed surfaces and a plurality of apertures extending therebetween, each of said apertures extending along an axis generally parallel to a first axis, said apertures being arranged in a number of arrays which is a multiple of three and which is greater than six, each array extending along a respective line generally parallel to a second axis extending perpendicular to said first axis, said arrays being spaced apart from one another as measured along a third axis extending perpendicular to said first and second axes; and
   b) a plurality of first contactor pins and a plurality of second contactor pins, each said pin extending through a respective said aperture, each contactor pin having first and second offset sections extending generally parallel to said first axis and a third section connecting said first and second sections and extending generally perpendicular to said first axis, said third section of each of said first contactor pins being longer than said third section of each of said second contactor pins, wherein said arrays are grouped as a plurality of units and wherein for each unit;
      1) said first and third arrays respectively contain both first and second contactor pins at alternating positions, said third portions of both of said first and second contactor pins located in said first and third arrays extending along said third imaginary axis away from said second array; and
      2) said second array contains said second contactor pins, said third portions of said second contactor pins located in said second array extend along said third imaginary axis and alternate between extending toward said first array and extending toward said third array, said second contactor pins located in said second array having third portions extending towards said first array are positioned in said second array at positions corresponding to positions of said second contactor pins in said first array, said second contactor pins located in said second array having third portions extending towards said third array are positioned in said second array at positions corresponding to positions of said second contactor pins in said third array.

6. The connector of claim 5, wherein said arrays are spaced at a distance which is 1.5 to 3 times the distance between said apertures of each array.

7. The connector of claim 5, wherein said third portion of each of said first contactor pins is 2 to 4 times longer than said third portion of each of said second contactor pins.

8. The connector of claim 5, wherein said third portion of each of said first contactor pins is 1 to 2 times longer than the distance between said arrays.

* * * * *